(12) United States Patent
Jang (10) Patent No.: US 8,816,427 B2
(45) Date of Patent: Aug. 26, 2014

(54) ALL AROUND GATE TYPE SEMICONDUCTOR DEVICE AND METHOD OF MANUFACTURING THE SAME

(75) Inventor: Tae Su Jang, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 651 days.

(21) Appl. No.: 12/266,453

(22) Filed: Nov. 6, 2008

(65) Prior Publication Data

US 2010/0019276 A1    Jan. 28, 2010

(30) Foreign Application Priority Data

Jul. 25, 2008   (KR) .................. 10-2008-0072824

(51) Int. Cl.
*H01L 29/66*   (2006.01)
(52) U.S. Cl.
USPC ........................................................ 257/329
(58) Field of Classification Search
USPC ................... 257/327, 328, 329, 401, E29.052
See application file for complete search history.

(56) References Cited

U.S. PATENT DOCUMENTS

| 6,900,521 B2 * | 5/2005 | Forbes et al. ................. 257/616 |
| 2004/0157353 A1 * | 8/2004 | Ouyang et al. .................. 438/38 |
| 2007/0148939 A1 * | 6/2007 | Chu et al. ...................... 438/590 |

FOREIGN PATENT DOCUMENTS

| JP | 2006-344937 | 12/2006 |
| KR | 1020050078145 A | 8/2005 |
| KR | 10-0572647 | 4/2006 |

* cited by examiner

*Primary Examiner* — Vongsavanh Sengdara
(74) *Attorney, Agent, or Firm* — Kilpatrick Townsend & Stockton LLP

(57) ABSTRACT

An all around gate type semiconductor device improves mobility of electrons and holes by using a silicon germanium pillar and a silicon layer surrounding the silicon germanium pillar as a vertical channel. A gate electrode is formed to surround the vertical channel. When a semiconductor device is used as a nMOSFET, the silicon layer strained by silicon germanium is used as the channel to increase electron mobility. When the semiconductor device is used as a pMOSFET, the silicon germanium pillar is used as the channel to increase hole mobility. Thus, the semiconductor device can enhance current supply capacity regardless of transistor type.

11 Claims, 13 Drawing Sheets

ALL AROUND GATE TYPE SEMICONDUCTOR DEVICE AND METHOD OF MANUFACTURING THE SAME

CROSS-REFERENCES TO RELATED APPLICATIONS

Priority is claimed to Korean patent application number 10-2008-0072824, filed on Jul. 25, 2008, which is incorporated by reference in its entirety.

BACKGROUND OF THE INVENTION

The present invention generally relates to a semiconductor device having a vertical channel, and more specifically, to an all around gate type semiconductor device to improve mobility of electrons and holes, and a method of manufacturing the same.

A semiconductor is required to be smaller in order to manufacture a high-integrated circuit. However, if the integration of the semiconductor device increases, a short channel effect may occur.

As a result, various methods for preventing the short channel effect and for reducing the device size have been developed.

In an ideal example of transistors designed for miniaturizing a semiconductor device and for preventing a short channel effect, an all around gate type transistor includes a gate that surrounds all channels.

In the conventional transistor, the channel width is reduced as the device region is decreased. However, in the all around gate type transistor, all peripheral regions of the channel surrounded by the gate electrode can be used as a channel, thereby increasing the width of the channel. As a result, the decrease of current due to the reduction of the channel width can be prevented.

Recently, various research has been conducted on all around gate type semiconductor devices having a vertical channel. However, in the manufacture of the all around gate type semiconductor devices having a vertical channel, an increase in the mobility of electrons and holes in the channel is required.

BRIEF SUMMARY OF THE INVENTION

Various embodiments of the present invention are directed at improving a vertical channel structure in an all around gate type semiconductor device to increase mobility of electrons and holes in the channel.

According to an embodiment of the present invention, an all around gate type semiconductor device comprises: a vertical channel pillar formed over a silicon substrate and comprising germanium; a silicon layer surrounding the vertical channel pillar; and a gate electrode surrounding the silicon layer.

Preferably, the all around gate type semiconductor device comprises: a first source/drain contact connected to the top surface of the vertical channel pillar; a second source/drain contact connected to the silicon layer; and a gate contact connected to the gate electrode.

In the all around gate type semiconductor device, the vertical channel pillar is a silicon germanium (SiGe) pillar including germanium ranging from 1% to 99%. The vertical channel pillar is doped with p-type or n-type impurities. The vertical channel pillar has a height and a width ranging from 1 nm to 500 nm and from 1 nm to 500 nm, respectively.

In the all around gate type semiconductor device, the silicon layer has a thickness ranging from 1 nm to 500 nm. The silicon layer is doped with p-type or n-type impurities.

Preferably, the all around gate type semiconductor device comprises a gate oxide film formed between the silicon layer and the gate electrode.

According to an embodiment of the present invention, a method of manufacturing an all around gate type semiconductor device comprises: forming a vertical channel pillar including germanium over a silicon substrate; forming a silicon layer surrounding the vertical channel pillar; forming a gate electrode surrounding the silicon layer; and forming a drain contact, a source contact and a gate contact connected to the vertical channel pillar, the silicon layer and the gate electrode, respectively.

Preferably, the forming-a-vertical-channel-pillar includes: forming a photoresist pattern that defines the vertical channel pillar region over the silicon substrate; forming a SiGe layer in the pillar region by an epitaxy process using the silicon substrate as a seed; etching and planarizing the SiGe layer; and removing the photoresist pattern. The epitaxy process is a vapor phase epitaxy process using chemical vapor of a silicon precursor and a germanium precursor.

Preferably, the forming-a-SiGe-layer further includes doping a dopant by an in-situ method. The concentration of impurities ranges from $1E10/cm^3$ to $1E20/cm^3$.

Preferably, the germanium ratio in the forming-a-SiGe-layer ranges from 1 to 99%.

Preferably, the silicon layer has a thickness ranging from 1 nm to 500 nm. The forming-a-silicon-layer further includes doping a dopant over the silicon layer by an in-situ method.

DESCRIPTION OF EMBODIMENTS

Figure 1:
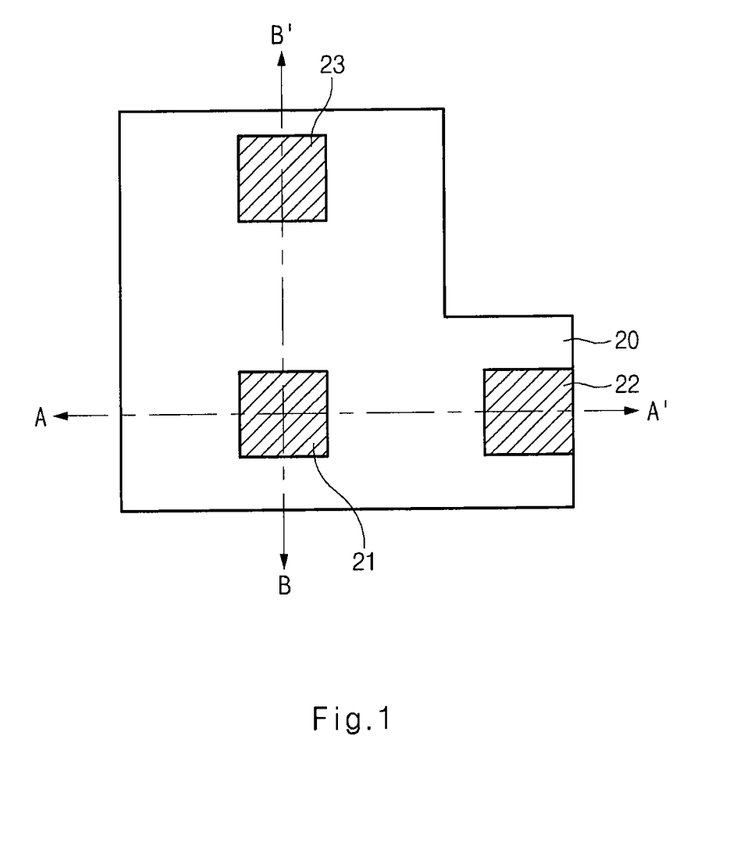
FIG. 1 is a plane diagram illustrating an all around gate type semiconductor device according to an embodiment of the present invention.
Figure 2:
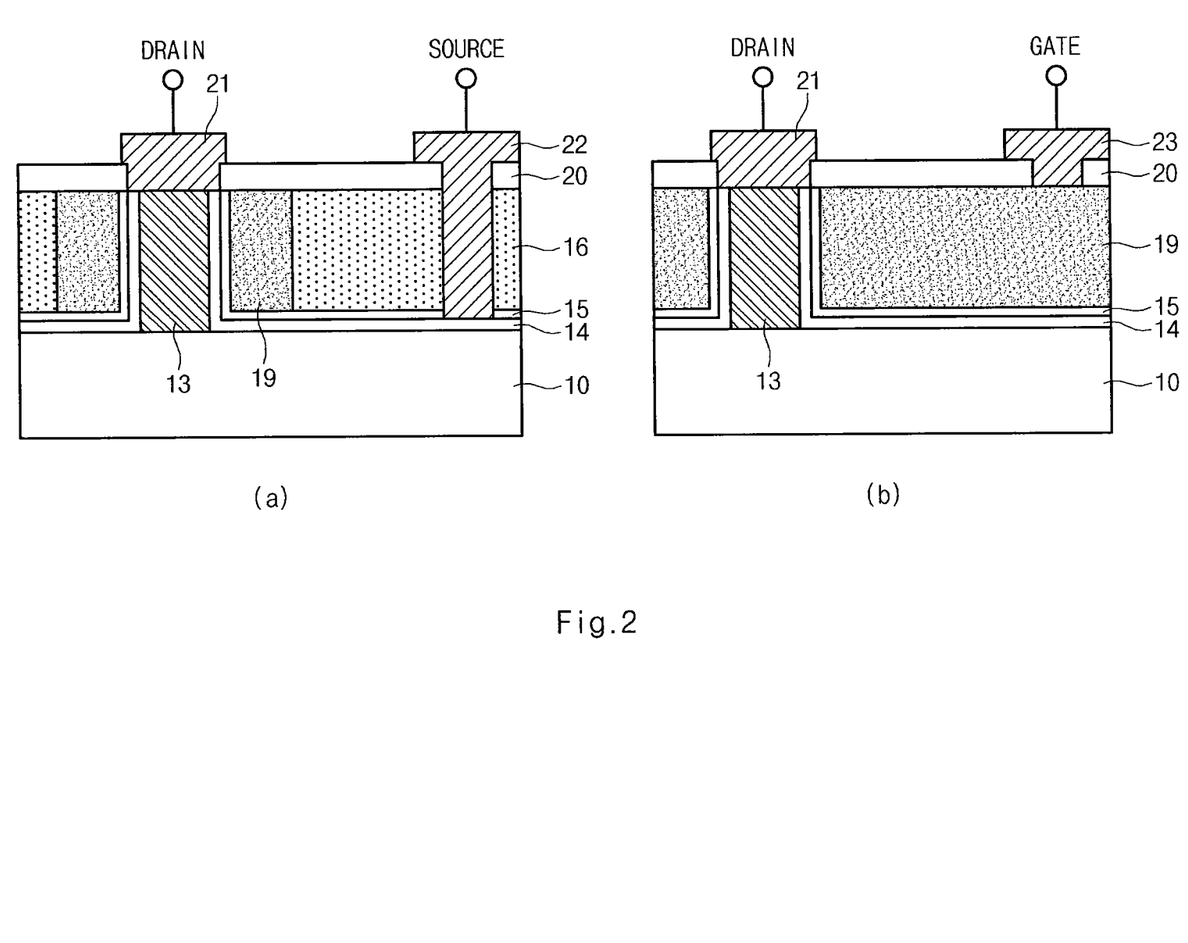
FIGS. 2a and 2b are cross-sectional diagrams taken along lines A-A' and B-B' of FIG. 1.

FIG. 1 is a plane diagram illustrating an all around gate type semiconductor device according to an embodiment of the present invention. FIGS. 2a and 2b are cross-sectional diagrams taken along lines A-A' and B-B' of FIG. 1.

In the all around gate type semiconductor device, a drain contact 21, a source contact 22 and a gate contact 23 are formed to protrude over an insulating film 20, and are arranged in an "L" shaped configuration. For example, the gate contact 23 is arranged with a given interval from the drain contact 21 in one direction, and the source 22 is arranged with a given interval from the drain contact 21 in a perpendicular direction.

The drain contact 21 is connected to a silicon germanium (SiGe) pillar 13 (when used as a pMOSFET), or to the SiGe pillar 13 and a silicon layer 14 (when used as nMOSFET). In this embodiment, the drain contact 21 is connected to the SiGe pillar 13 and the silicon layer 14. The SiGe pillar 13 and the silicon layer 14 are formed by an epitaxy method, and are used as a vertical channel for mobility of holes or electrons in the all around gate type semiconductor device.

The SiGe piller 13 is surrounded by the silicon layer 14, a gate oxide ($SiO_2$) film 15 and a gate electrode 19 sequentially.

That is, the vertical channel is formed to have a cross-sectional structure including a gate electrode/a gate oxide film/a silicon layer/a silicon germanium pillar/a silicon layer/a gate oxide film/a gate electrode as shown in FIG. 2a. The SiGe pillar 13 includes germanium ranging from 1% to 99%. Into the SiGe pillar 13 and the silicon layer 14, p-type or n-type impurities may be doped by an in-situ method depending on transistor types. The doping concentration ranges from 1E10 to $1E20/cm^3$. The height and width of the SiGe pillar 13 range from 1 nm to 500 nm and 1 nm to 300 nm, respectively. The thickness of the silicon layer 14 ranges from 1 nm to 500 nm.

The source contact 22 is formed to contact with the silicon layer 14 by etching the insulating films 20 and 16, and is separated from the gate electrode 19 by the insulating film 16.

The gate contact 23 is connected to the gate electrode 19 extended in a vertical direction while surrounding the vertical channel including the SiGe pillar 13 as shown in FIG. 2b.

FIGS. 3 to 12 are diagrams illustrating a method of manufacturing an all around gate type semiconductor device according to an embodiment of the present invention. In FIGS. 3 to 12, (a) shows a cross-sectional view, and (b) shows a plane view.

Figure 3:
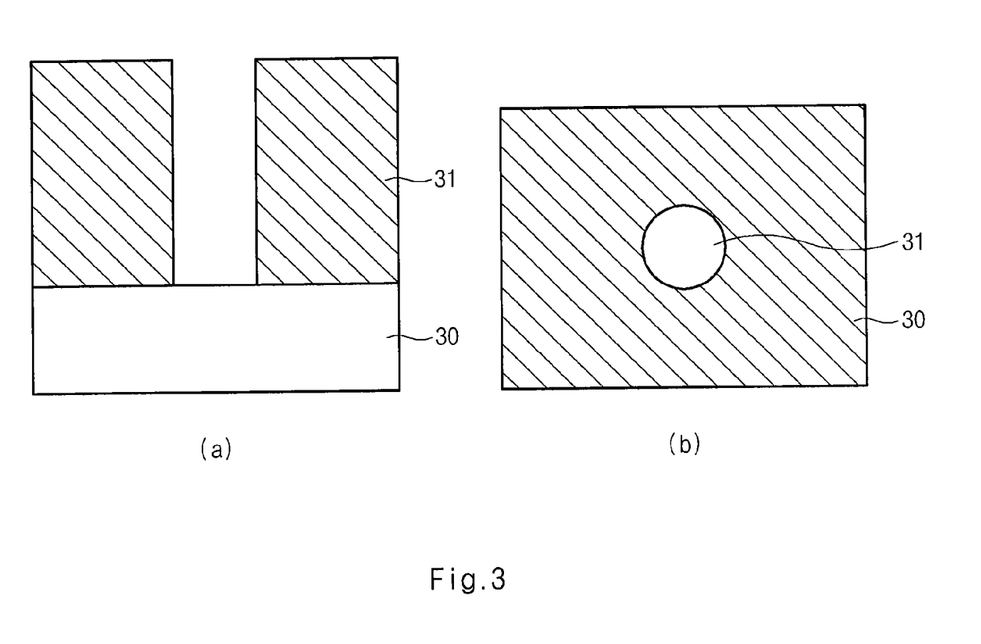
FIGS. 3 to 12 are diagrams illustrating a method of manufacturing an all around gate type semiconductor device according to an embodiment of the present invention.

Referring to FIG. 3, a photoresist film (not shown) is formed over a silicon substrate 30.

After the photoresist film is exposed with a mask that defines a region where a SiGe pillar is to be formed, the exposed photoresist film is developed to obtain a photoresist pattern 31.

Figure 4:
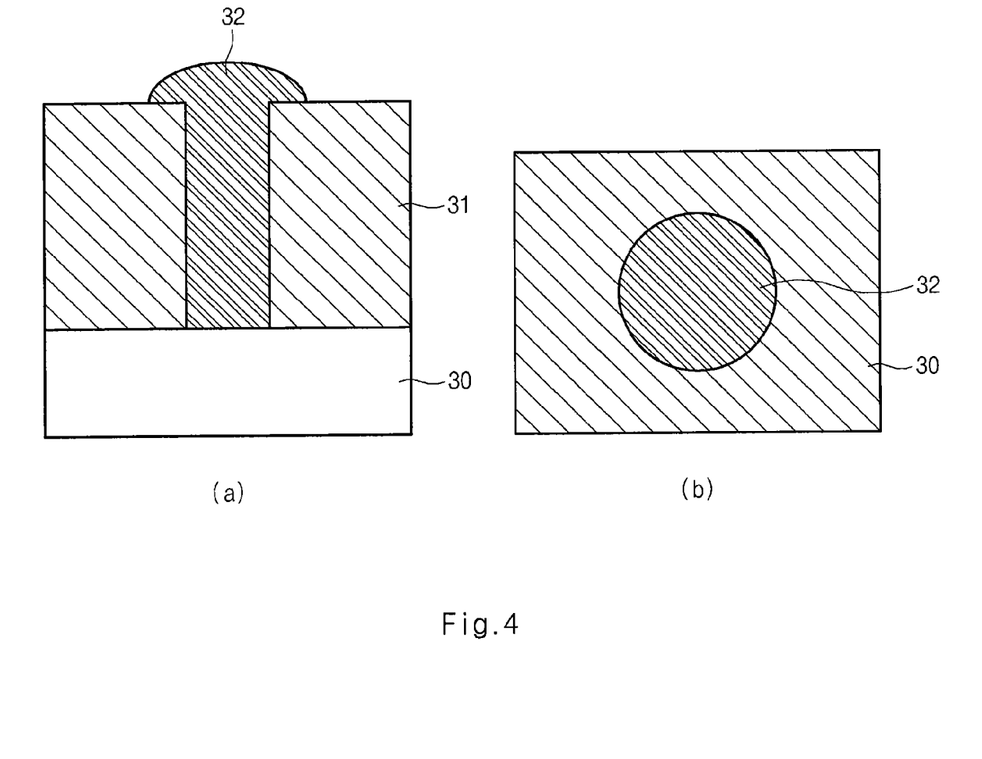

Referring to FIG. 4, a SiGe layer 32 is formed over the silicon substrate 30 as a seed, which is exposed by the photoresist pattern 31.

The SiGe layer 32 may be formed by an epitaxy process, which contains a vapor phase epitaxy process using chemical vapor of trisilane ($Si_3H_3$) as a silicon precursor and $GeH_4$ as a germanium precursor. The SiGe layer 32 includes germanium ranging from 1% to 99%.

When the SiGe layer 32 is formed, a desired dopant is doped by an in-situ method depending on transistor types. That is, impurities are doped into the SiGe layer 32 so that the SiGe pillar formed by a subsequent process may serve as a channel. P-type impurities are doped when the transistor is a nMOSFET, while n-type impurities are doped when the transistor is a pMOSFET. The doping concentration of the p-type or n-type impurities ranges from $1E10/cm^3$ to $1E20/cm^3$.

Figure 5:
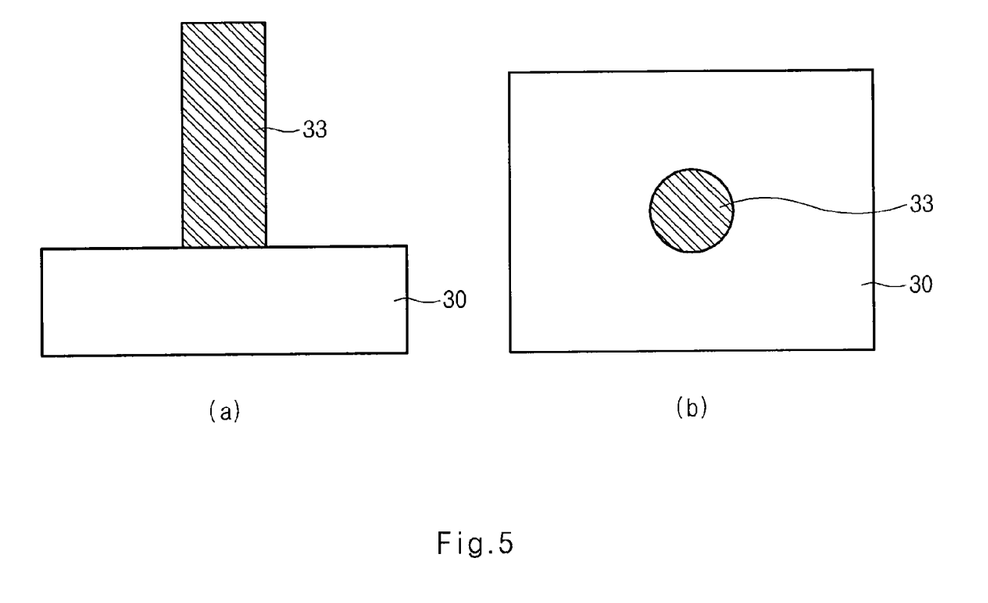

Referring to FIG. 5, a CMP process is performed on the SiGe layer 32 to expose the photoresist pattern 31. Then the photoresist pattern 31 is removed to obtain a SiGe pillar 33 having a given height.

The height and width of the SiGe pillar 33 vary within the range from 1 nm to 500 nm and from 1 nm to 500 nm, respectively.

Figure 6:
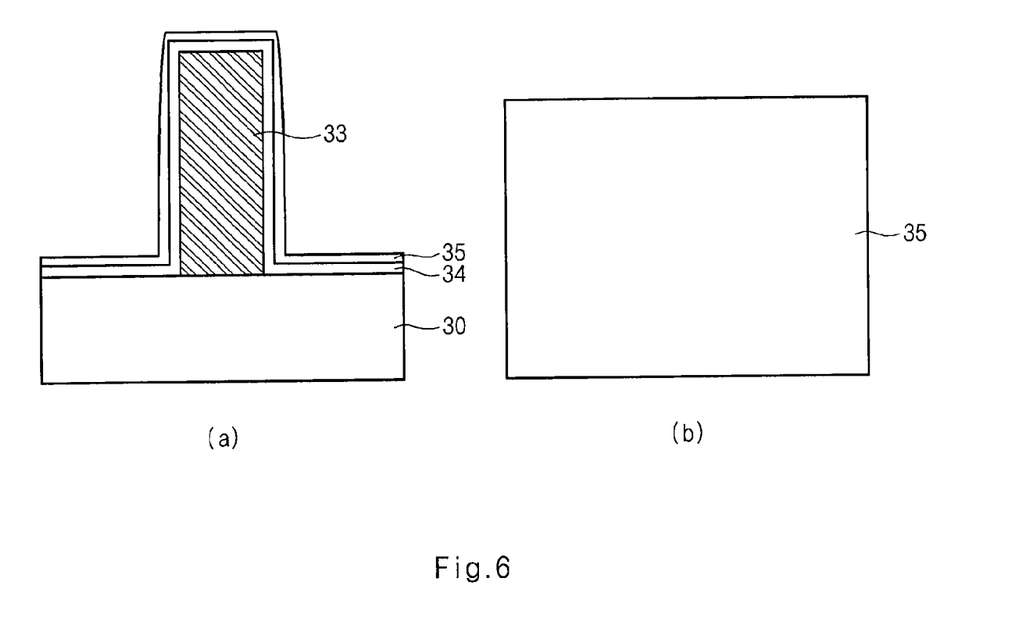

Referring to FIG. 6, a Si layer 34 and a gate oxide ($SiO_2$) film 35 are sequentially formed over the SiGe pillar 33 and the silicon substrate 30. That is, through an epitaxy process, the Si layer 34 is deposited over the SiGe pillar 33 and the silicon substrate 30, and the $SiO_2$ film is formed over the Si layer 34. The Si layer 34 has a thickness ranging from 1 nm to 500 nm. The gate oxide film 35 has a thickness ranging from 1 nm to 100 nm.

When the Si layer 34 is formed, a desired dopant may be doped by an in-situ method depending on transistor types in the same way as when the SiGe pillar 33 is formed so that the Si layer 34 may serve as a channel. For example, p-type impurities are doped into the Si layer 34 when the nMOSFET is formed, while n-type impurities are doped into the Si layer 34 when the pMOSFET is formed.

The reason why the Si layer 34 is formed over the SiGe pillar 33 is described below.

First, the characteristics of SiGe are not as good as those of $SiO_2$ because germanium may cause degradation of device characteristics. Before the gate oxide film 35 is formed, the Si layer 34 is formed over the SiGe pillar 33 by the epitaxy process, thereby improving the interface characteristic.

Second, the Si layer 34 strained by SiGe improves the current supply capacity of the transistor because electron mobility is increased. That is, since Si has a smaller lattice constant than that of SiGe, if the thin Si layer 34 is formed over the SiGe pillar 33, the Si layer is strained by a difference of the lattice constant between SiGe and Si. In this way, if the Si layer 34 is strained, the electrical carrier mobility in the Si layer 34 is increased. As a result, the electron mobility through the Si layer 34 may be further increased when the semiconductor device according to the embodiment of the present invention is operated as a nMOSFET.

Figure 7:
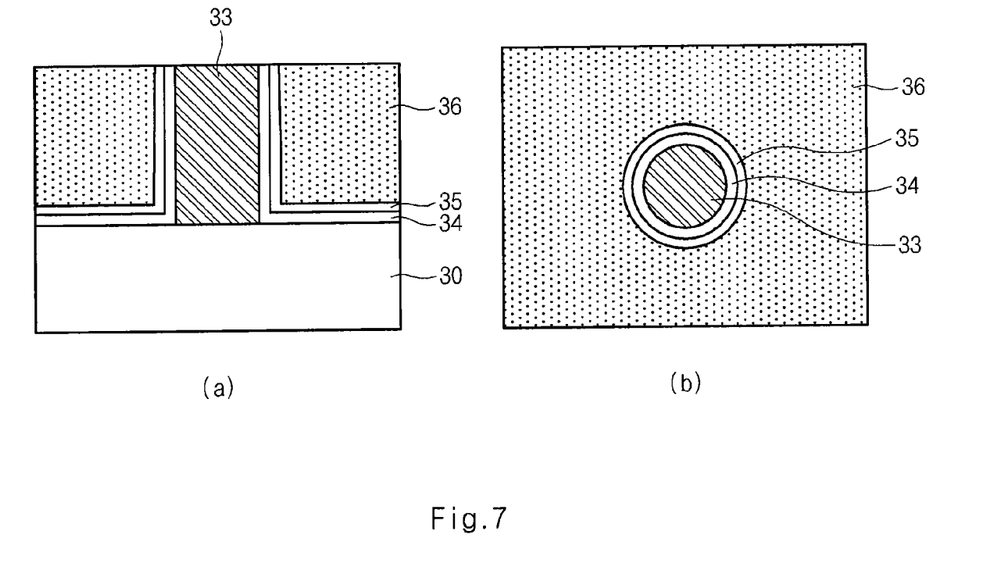

Referring to FIG. 7, after a first insulating film 36 is formed over the gate oxide film 35, the first insulating film 36, the gate oxide film 35 and the Si layer 34 are sequentially etched until the top surface of the SiGe pillar 33 is exposed.

Figure 8:
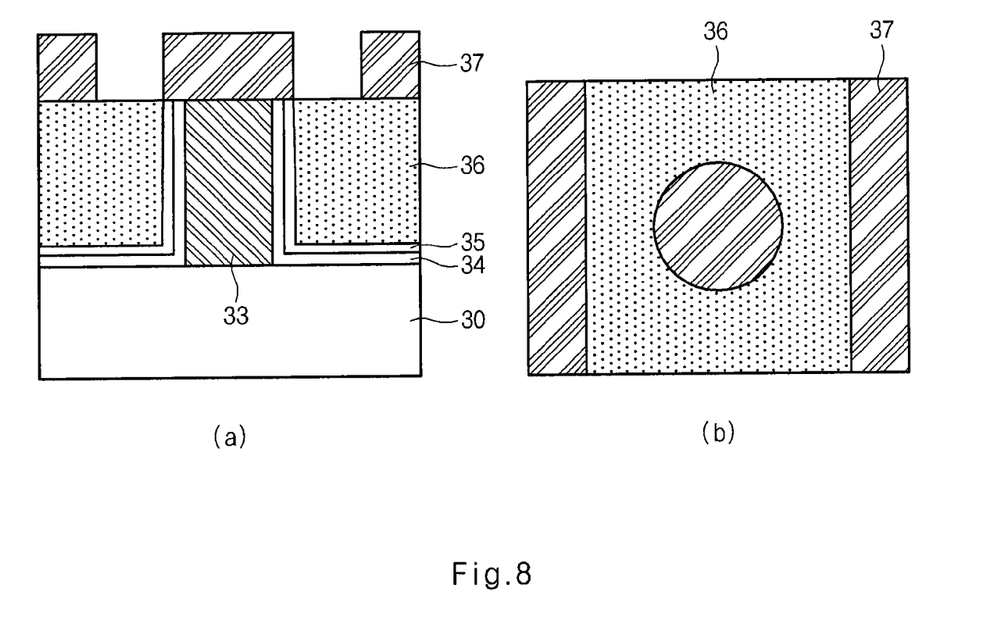

Referring to FIG. 8, a photoresist film (not shown) is formed over the resulting structure of FIG. 7. After the photoresist film is exposed with a gate mask (not shown) that defines a region where a gate electrode is formed, the exposed photoresist film is developed to obtain a photoresist pattern 37.

Figure 9:
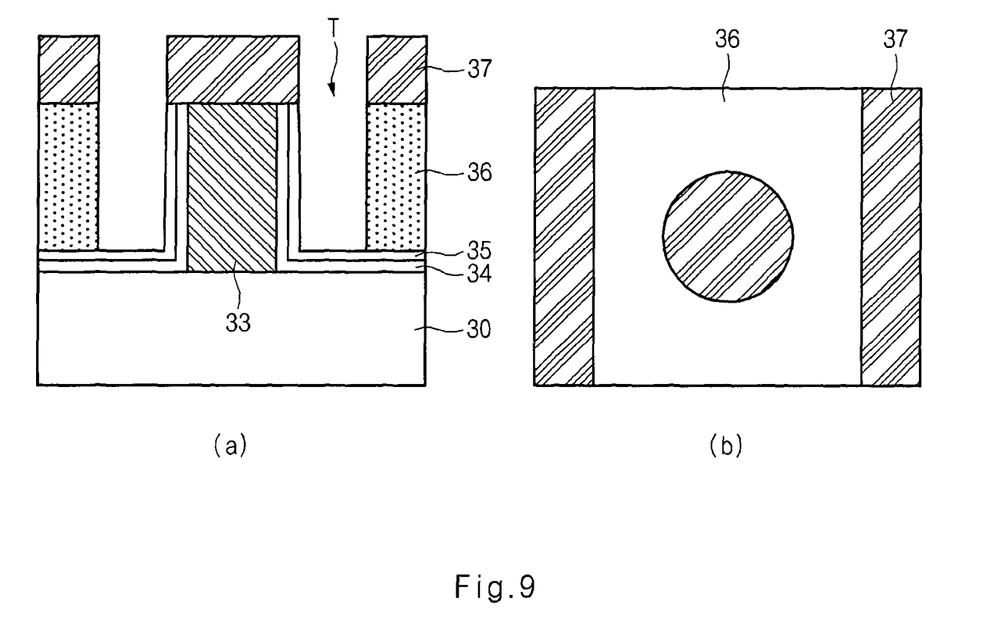

Referring to FIG. 9, the first insulating film 36 is selectively etched using the photoresist pattern 37 as an etch mask until the gate oxide film 35 is exposed, thereby obtaining a trench T.

Figure 10:
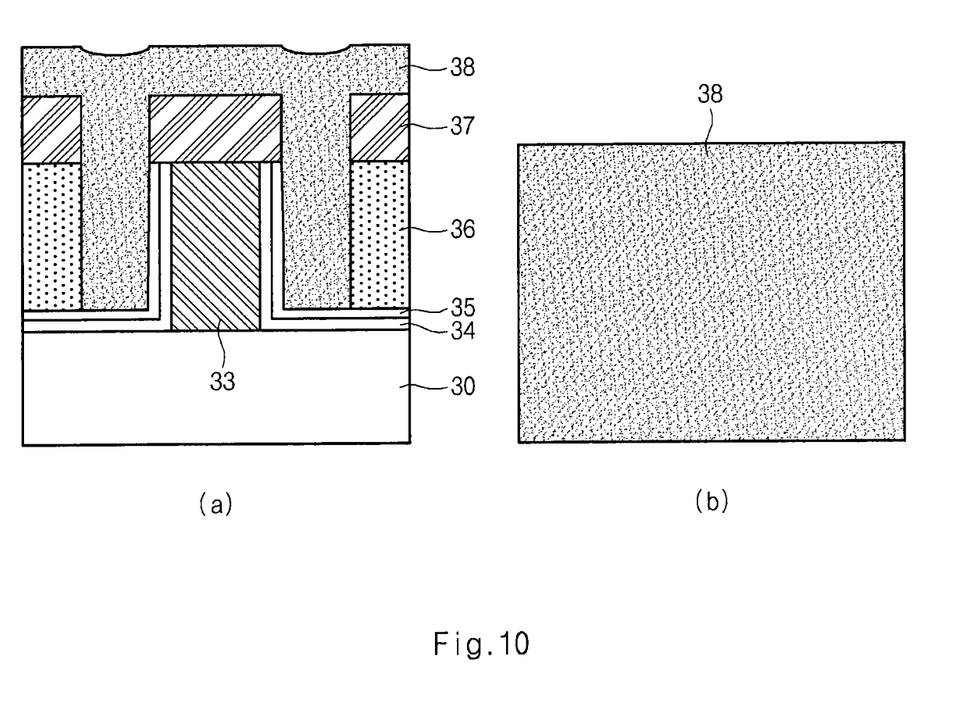

Referring to FIG. 10, a gate electrode material 38 is formed over the resulting structure of FIG. 9 to fill the trench T.

Figure 11:
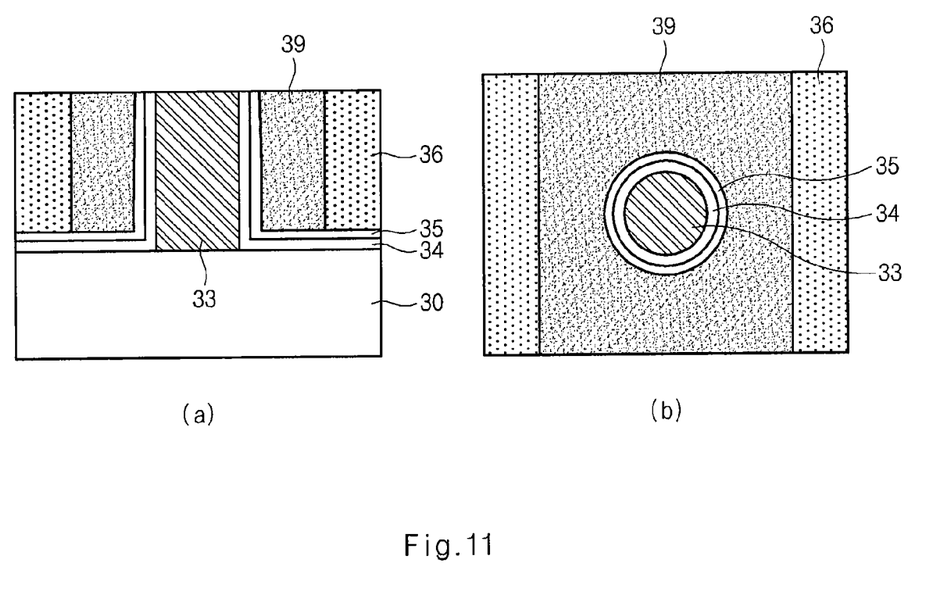

Referring to FIG. 11, the gate electrode material 38 and the photoresist pattern 37 are sequentially etched until the top surface of the SiGe pillar 33 is exposed, thereby obtaining a gate electrode 39.

Figure 12A:
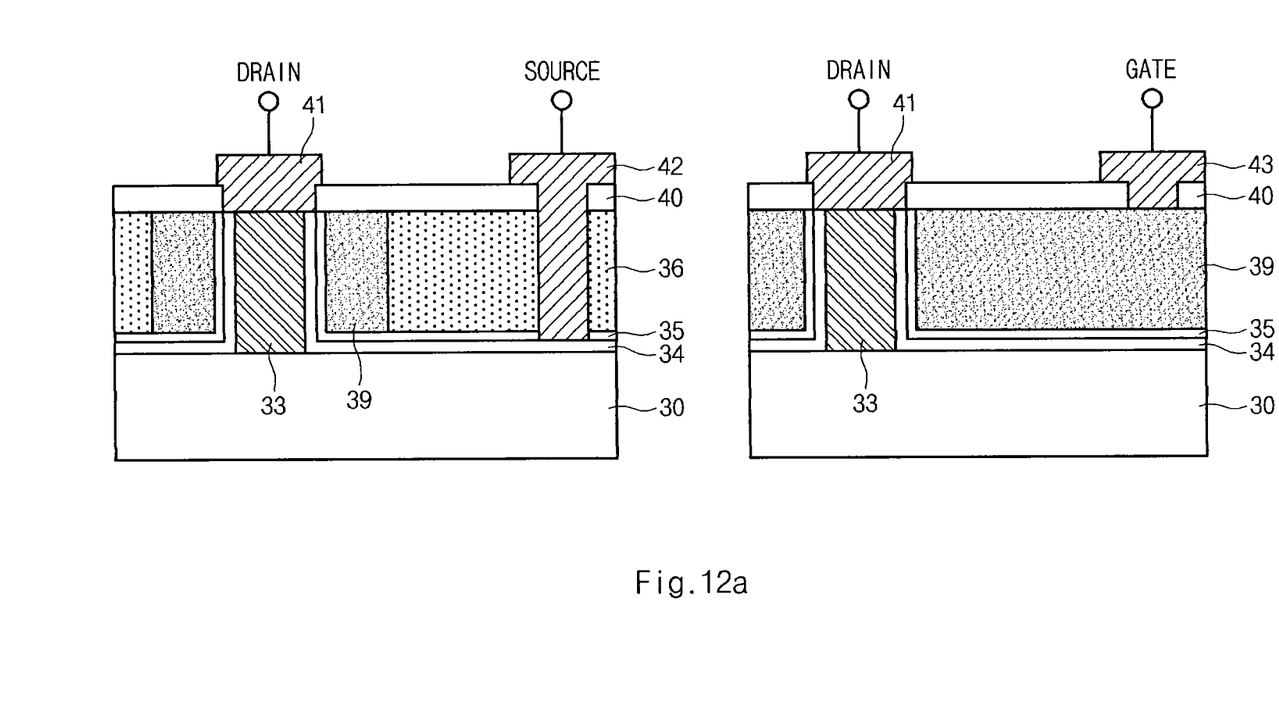
Figure 12B:
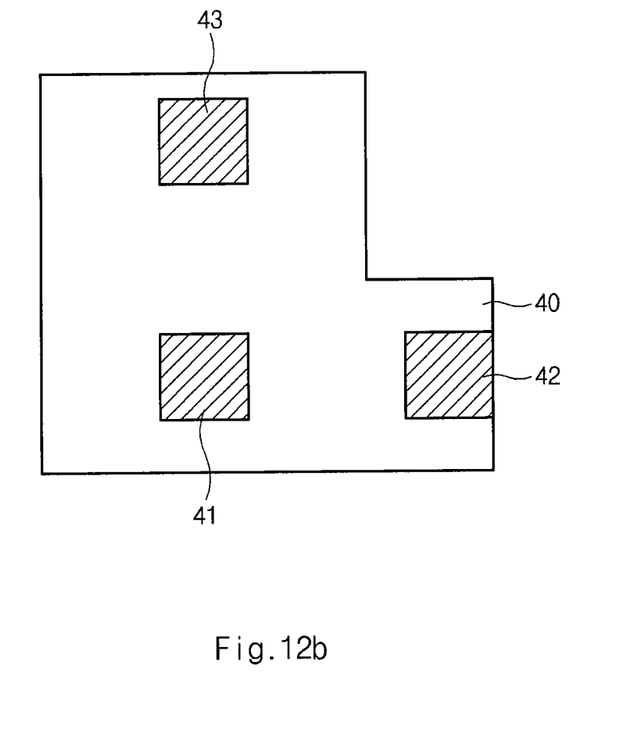

Referring to FIGS. 12a and 12b, a second insulating film 40 is formed over the resulting structure of FIG. 11. A contact hole pattern (not shown) is formed over the second insulating film 40 with a contact hole mask (not shown) that defines a drain contact hole (not shown), a source contact hole (not shown) and a gate contact hole (not shown).

The second insulating film 40 is selectively etched or the second insulating film 40, the first insulating film 36 and the gate oxide film 35 are selectively etched using the contact hole pattern (not shown) as an etch mask depending on the contact hole region. That is, in the region where the drain contact hole and the gate contact hole are formed, the second insulating film 40 is selectively etched until the SiGe pillar 33 and the gate electrode 39 are exposed. In the region where the source contact hole is formed, the second insulating film 40, the first insulating film 36 and the gate oxide film 35 are selectively etched until the Si layer 34 is exposed.

A landing plug poly (not shown) is formed by filling the etched region. The landing plug poly is patterned with the contact mask (not shown) that defines a drain contact 41, a source contact 42 and a gate contact 43, thereby obtaining the drain contact 41, the source contact 42 and the gate contact 43.

As described above, according to an embodiment of the present invention, a vertical channel is formed to have a structure where the Si layer 35 surrounds the SiGe pillar 33, and a gate electrode is formed to surround the vertical channel, thereby increasing the electrical carrier mobility.

That is, when a semiconductor device according to the embodiment of the present invention is used as a nMOSFET, the Si layer 34 strained by SiGe is used as a channel to increase electron mobility. Moreover, when the semiconductor device is used as a pMOSFET, the SiGe pillar 33 is used as a channel, thereby increasing hole mobility. In this way, the semiconductor device according to the embodiment of the present invention can improve electron and hole mobility, thereby enhancing current supply capacity regardless of transistor type.

Although the SiGe pillar is exemplified as a vertical channel pillar in the embodiment, a Ge pillar may be used instead of the SiGe pillar. A method for depositing germanium in a silicon substrate to have a given height by a vapor epitaxial process can be easily performed by a person having an ordinary skill in the art with reference to the above-described method.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An all-around gate type semiconductor device comprising:
   a vertical pillar formed over a silicon substrate and comprising germanium;
   a silicon layer surrounding the vertical pillar;
   a dielectric layer surrounding the silicon layer that surrounds the vertical pillar;
   a gate electrode surrounding the dielectric layer;
   a first source/drain contact contacted directly with a top surface of the vertical pillar and the silicon layer, wherein the silicon layer and the dielectric layer are absent from the top surface of the vertical pillar;
   a second source/drain contact connected to the silicon layer; and
   a gate contact connected to the gate electrode at a top surface of the gate electrode that is coplanar with the top surface of the vertical pillar.

2. The all around gate type semiconductor device according to claim 1, wherein the vertical pillar is a silicon germanium(SiGe) pillar.

3. The all around gate type semiconductor device according to claim 1, wherein the SiGe pillar includes germanium ranging from 1% to 99%.

4. The all around gate type semiconductor device according to claim 1, wherein the vertical pillar is doped with p-type impurities.

5. The all around gate type semiconductor device according to claim 1, wherein the vertical pillar is doped with n-type impurities.

6. The all around gate type semiconductor device according to claim 1, wherein the vertical pillar has a height ranging from 1 nm to 500 nm.

7. The all around gate type semiconductor device according to claim 1, wherein the vertical pillar has a width ranging from 1 nm to 300 nm.

8. The all around gate type semiconductor device according to claim 1, wherein the silicon layer has a thickness ranging from 1 nm to 500 nm.

9. The all around gate type semiconductor device according to claim 1, wherein the silicon layer is doped with p-type impurities.

10. The all around gate type semiconductor device according to claim 1, wherein the silicon layer is doped with n-type impurities.

11. The all around gate type semiconductor device according to claim 1, further comprising a gate oxide film formed between the silicon layer and the gate electrode.

* * * * *